US012740457B2

(12) United States Patent
Chen et al.

(10) Patent No.: US 12,740,457 B2
(45) Date of Patent: Sep. 15, 2026

(54) SUBSTRATE STRUCTURE INCLUDING STACKED SUBSTRATES DISPOSED IN A SHELL

(71) Applicant: QUALCOMM Incorporated, San Diego, CA (US)

(72) Inventors: Yujen Chen, Taichung (TW); Yangyang Sun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 355 days.

(21) Appl. No.: 18/542,052

(22) Filed: Dec. 15, 2023

(65) Prior Publication Data

US 2025/0201687 A1 Jun. 19, 2025

(51) Int. Cl.

| | |
|---|---|
| ***H01L 21/68*** | (2006.01) |
| ***H10W 70/685*** | (2026.01) |
| ***H10W 90/00*** | (2026.01) |
| *H10W 72/20* | (2026.01) |
| *H10W 72/90* | (2026.01) |
| *H10W 74/00* | (2026.01) |

(52) U.S. Cl.

CPC ......... *H10W 70/685* (2026.01); *H10W 90/00* (2026.01); *H10W 90/701* (2026.01); *H10W 72/244* (2026.01); *H10W 72/923* (2026.01); *H10W 72/942* (2026.01); *H10W 74/00* (2026.01)

(58) Field of Classification Search

CPC . H10W 70/685; H10W 90/00; H10W 90/701; H10W 72/244; H10W 72/923; H10W 72/942; H10W 74/00; H10W 72/01; H10W 72/834; H10W 90/20; H01G 4/012; H01G 4/005; H01G 4/228; H01G 4/33; H01G 4/38; H10D 1/047

USPC .......................................................... 257/700

See application file for complete search history.

(56) References Cited

U.S. PATENT DOCUMENTS 6,437,385 B1 * 8/2002 Bertin .................. H10B 12/038 257/E21.651
6,972,451 B2 * 12/2005 Delpech ................. H10D 1/043 257/305

(Continued)

FOREIGN PATENT DOCUMENTS

JP 2001210646 A 8/2001

OTHER PUBLICATIONS

International Search Report and Written Opinion—PCT/US2024/057717—ISA/EPO—Apr. 7, 2025.

*Primary Examiner* — Vu A Vu
(74) *Attorney, Agent, or Firm* — Muncy, Geissler, Olds & Lowe, P.C.

(57) ABSTRACT

In an aspect, a substrate structure includes plurality of substrates encapsulated in a shell in a stacked relationship; at least one electronic component in each substrate of the plurality of substrates, wherein the at least one electronic component includes at least a first terminal and a second terminal; a first redistribution layer (RDL) disposed over each substrate of the plurality of substrates configured to electrically couple the first terminal of the at least one electronic component with a respective first terminal disposed over an outer edge of the shell; and a second RDL disposed over each substrate of the plurality of substrates and configured to electrically couple the second terminal of the at least one electronic component with a respective second terminal disposed over the outer edge of the shell.

24 Claims, 15 Drawing Sheets

(56) References Cited

U.S. PATENT DOCUMENTS

| | | | | |
|---|---|---|---|---|
| 7,880,275 | B2 * | 2/2011 | Pagaila | H10W 90/00 257/659 |
| 8,368,201 | B2 * | 2/2013 | Tuominen | H05K 1/0218 257/E23.005 |
| 9,018,772 | B2 * | 4/2015 | Liao | H10W 70/65 257/777 |
| 9,337,073 | B2 * | 5/2016 | Liu | H10P 72/74 |
| 9,521,794 | B2 * | 12/2016 | Sibuet | H05K 13/046 |
| 9,647,057 | B2 * | 5/2017 | Voiron | H10D 1/042 |
| 9,659,878 | B2 * | 5/2017 | Chen | H10W 42/20 |
| 10,164,005 | B2 * | 12/2018 | Tsui | H10D 1/716 |
| 11,282,778 | B2 * | 3/2022 | Fang | H10W 74/117 |
| 11,769,792 | B2 * | 9/2023 | Cheng | H10D 1/042 257/532 |
| 2009/0141426 | A1 * | 6/2009 | Hwang | H01G 4/33 361/321.2 |
| 2020/0411481 | A1 | 12/2020 | Yang et al. | |
| 2021/0159182 | A1 | 5/2021 | Jeng et al. | |
| 2021/0305164 | A1 | 9/2021 | Tseng et al. | |

* cited by examiner

SUBSTRATE STRUCTURE INCLUDING STACKED SUBSTRATES DISPOSED IN A SHELL

FIELD OF DISCLOSURE

The present disclosure generally relates to a substrate, and more particularly, to a stacked substrate structure having edge terminals, and methods of making the substrate structure.

BACKGROUND

Integrated circuit (IC) technology has achieved great strides in advancing computing power through miniaturization of electrical components. An IC may be implemented as an IC chip with a set of circuits integrated thereon. In some implementations, one or more IC chips can be physically carried and protected by an IC package, where various power and signal nodes of the one or more IC chips can be electrically coupled to respective conductive terminals of the IC package via electrical paths formed in a package substrate of the IC package. Various packaging technologies can be found in many electronic devices, including processors, servers, radio frequency (RF) integrated circuits, etc. Advanced packaging and processing techniques can be used to implement complex devices, such as multi-electronic component devices and system-on-a-chip (SOC) devices, which may include multiple function blocks, with each function block designed to perform a specific function, such as, for example, a microprocessor function, a graphics processing unit (GPU) function, a communications function (e.g., WiFi, Bluetooth, and other communications), and the like.

In some implementations, embedded electronic components, such as deep trench capacitors, have been incorporated in IC packaging for performance improvement and package size reduction. One factor driving the use of such embedded electronic components is the desire to obtain small form factor products with equivalent or better electrical performance than their larger electronic component counterparts.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a substrate structure includes plurality of substrates encapsulated in a shell in a stacked relationship; at least one electronic component in each substrate of the plurality of substrates, wherein the at least one electronic component includes at least a first terminal and a second terminal; a first redistribution layer (RDL) disposed over each substrate of the plurality of substrates configured to electrically couple the first terminal of the at least one electronic component with a respective first terminal disposed over an outer edge of the shell; and a second RDL disposed over each substrate of the plurality of substrates and configured to electrically couple the second terminal of the at least one electronic component with a respective second terminal disposed over the outer edge of the shell.

In an aspect, an electronic device includes a substrate structure comprising: plurality of substrates encapsulated in a shell in a stacked relationship; at least one electronic component in each substrate of the plurality of substrates, wherein the at least one electronic component includes at least a first terminal and a second terminal; a first redistribution layer (RDL) disposed over each substrate of the plurality of substrates configured to electrically couple the first terminal of the at least one electronic component with a respective first terminal disposed over an outer edge of the shell; and a second RDL disposed over each substrate of the plurality of substrates and configured to electrically couple the second terminal of the at least one electronic component with a respective second terminal disposed over the outer edge of the shell.

In an aspect, a method of fabricating a substrate structure includes orienting a plurality of substrates for concurrent processing, wherein each substrate of the plurality of substrates includes at least one electronic component, and wherein the at least one electronic component includes at least a first terminal and a second terminal; forming a first redistribution layer (RDL) over each substrate of the plurality of substrates, wherein the first RDL is electrically coupled to the first terminal of the at least one electronic component of each substrate of the plurality of substrates; and forming a second RDL over each substrate of the plurality of substrates will, wherein the second RDL is electrically coupled to the second terminal of the at least one electronic component; encapsulating the plurality of substrates in a stacked relationship in a shell; and forming a metallization structure over an outer edge of the shell, wherein the metallization structure is configured to electrically couple the first RDL of each substrate to a respective first terminal at the outer edge of the shell and for coupling the second RDL of each substrate to a respective second terminal at the outer edge of the shell.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be recognized, based on the teachings of the present disclosure, that the term "over" indicates a sequential or hierarchical arrangement of layers, where one layer is functionally 'above' another, but not necessarily physically in contact with it.

Certain aspects of the disclosure are directed to substrate structures having stacked substrates with edge connections. In an aspect, the substrates may carry active devices (e.g., transistors) and/or passive components (e.g., resistors, capacitors, inductors, etc.) In the context of the present disclosure, each of the stacked substrates include deep trench capacitors (DTCs) that are interconnected with one another. However, it will be recognized, based on the teachings of the present disclosure, that each of the substrates may carry other devices and components. Further, it will be recognized, based on the teachings of the present disclosure, that a given substrate of the stacked substrates may carry different devices and/or components than other substrates of the stacked substrates.

Figure 1:
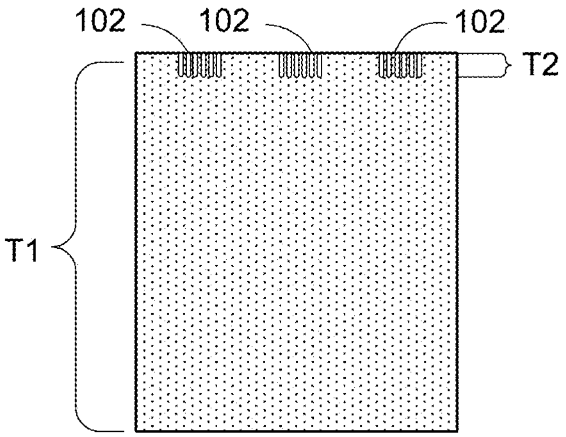
FIG. 1 depicts a substrate in which a plurality of deep trench capacitors (DTCs) have been formed, according to aspects of the disclosure.

FIG. 1 depicts a substrate 100 in which a plurality of DTCs 102 have been formed, according to aspects of the disclosure. In an aspect, the substrate 100 may have a conventional thickness T1 of 760 micrometers. Further, the DTCs 102 may have a conventional trench depth T2 of 8 micrometers. As such, a substantial portion of the thickness T1 of the substrate 100 remains unused, which can complicate the ability of the structure to meet the ever-increasing need for reduced device sizes.

Figure 2:
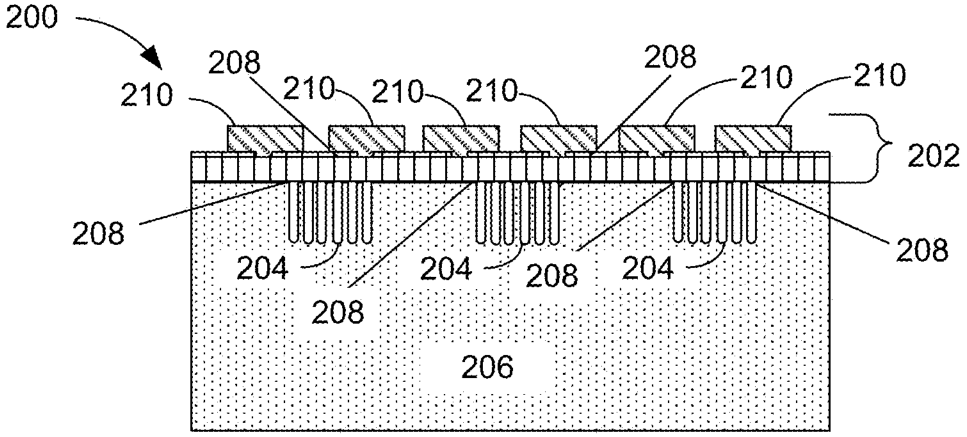
FIG. 2 depicts a substrate having a metallization structure formed over the plurality of DTCs formed in a substrate, according to aspects of the disclosure.

FIG. 2 depicts a substrate structure 200 having a metallization structure 202 formed over the plurality of DTCs 204 formed in a substrate 206, according to aspects of the disclosure. In an aspect, the metallization structure 202 electrically couples the terminals 208 (e.g., the portions of each DTC forming the nodes of the capacitor) of the DTCs 204 to respective terminals 210 at an upper surface of the substrate structure 200. In this example, there are two terminals 210 associated with each DTC 204, where each terminal 210 is electrically coupled to a respective terminal 208 of the corresponding DTC 204.

Figure 3A:
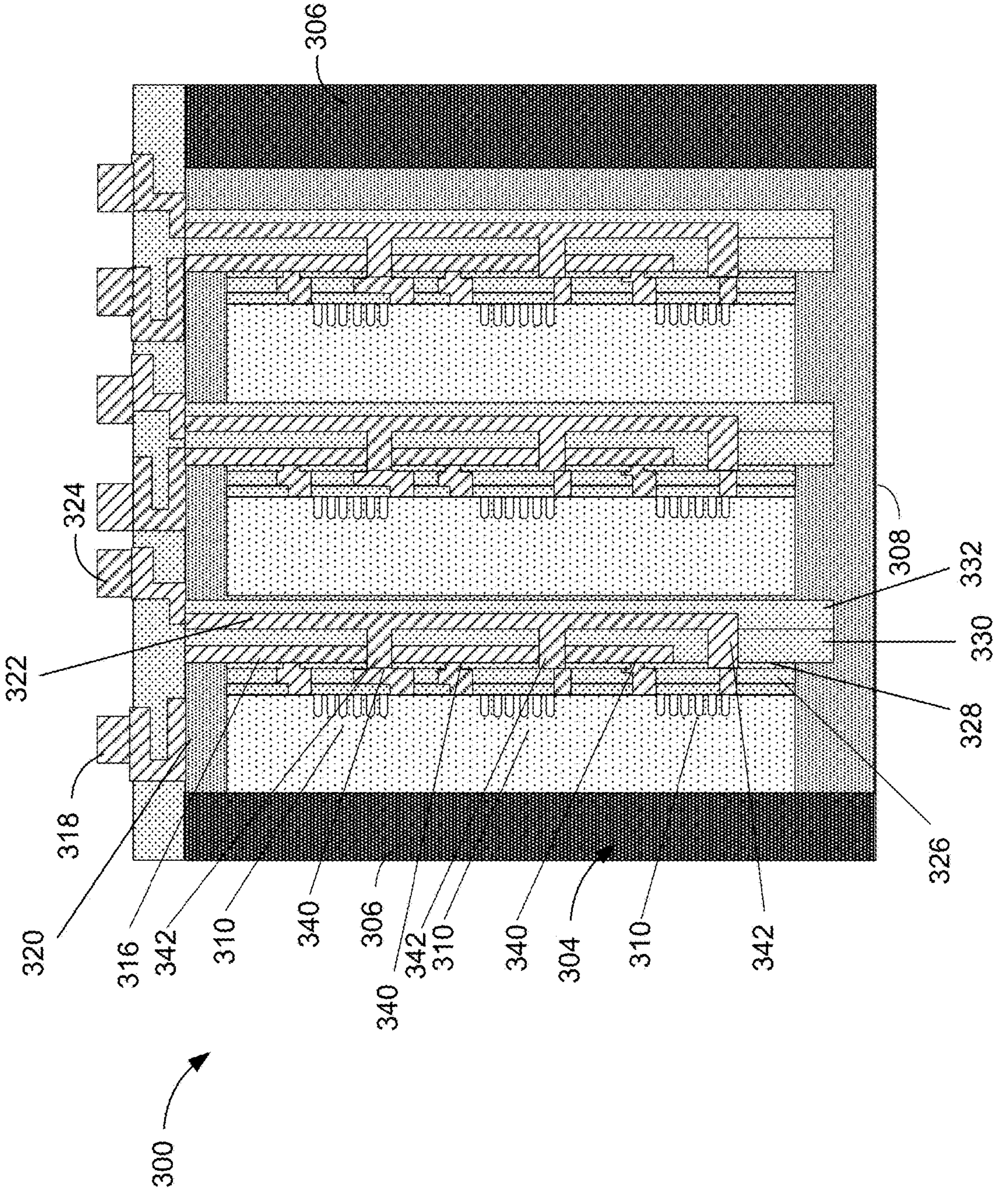
FIG. 3A and FIG. 3B depict an example of a substrate structure, according to aspects of the disclosure.
Figure 3B:
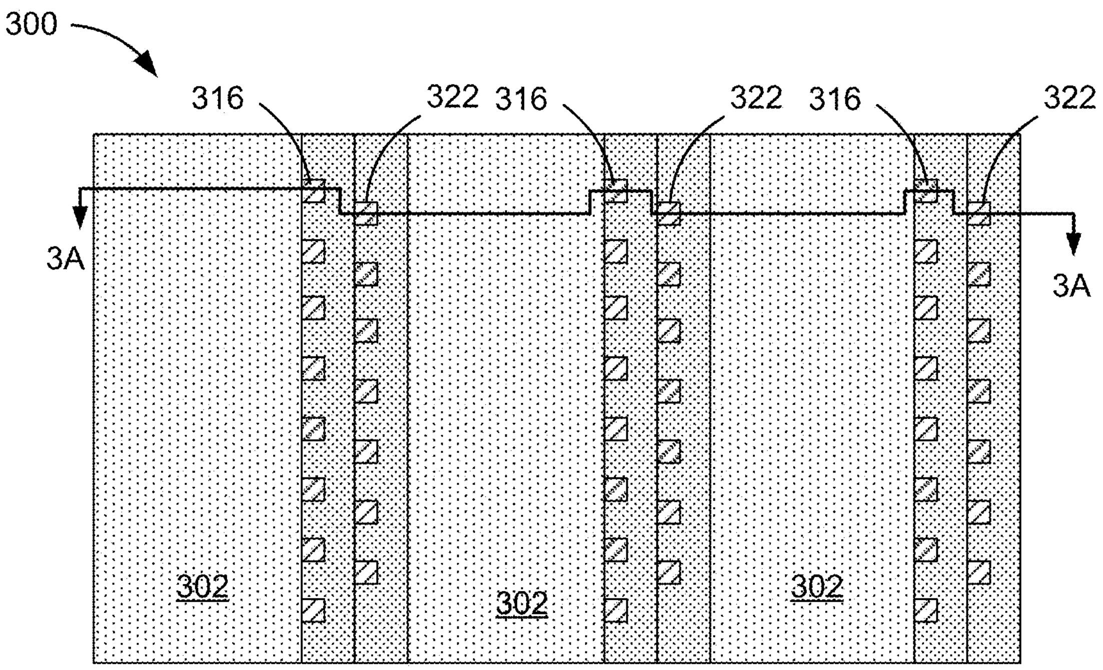

Certain aspects of the disclosure are implemented with a recognition that conventional substrate structures, such as those shown in FIGS. 1 and 2, may not be suitable for the increased miniaturization challenges associated with up-and-coming electronic device designs. FIG. 3A and FIG. 3B depict an example of a substrate structure 300, according to aspects of the disclosure. FIG. 3A as a cross-sectional side view of the example substrate structure 300 as viewed along the cross-sectional line 3A shown in FIG. 3B. FIG. 3B is a top view of the example substrate structure 300, where line 3A shows how the cross-section is made through the substrate structure 300 shown in FIG. 3A. In an aspect, the substrate structure 300 may be leveraged to achieve high-density component configurations suitable for existing and future miniaturization challenges.

In accordance with various aspects of the disclosure, the substrate structure 300 includes a plurality of substrates 302 in a stacked relationship that are encapsulated in a protective shell 304. In an aspect, the protective shell 304 may be comprised of a molding compound. In the example shown in FIG. 3A, there are multiple molding compound structures 306 and 308 that form the protective shell 304. The multiple molding compound structures 306 and 308 may be formed from the same molding compound or from different molding compounds dependent upon the processes used to fabricate the substrate structure 300 and/or device requirements that must be met by the substrate structure 300.

In accordance with further aspects of the disclosure, a plurality of electronic components 310 are formed in each substrate 302 of the plurality of stacked substrates. In an aspect, each electronic component 310 of the plurality of components formed in each substrate 302 includes at least a first terminal 312 and a second terminal 314. In the example shown in FIG. 3A, each of the electronic components 310 is formed as a two-terminal DTC. However, it will be recognized, based on the teachings of the present disclosure, that 1) electronic components 310 other than DTCs may be formed in each substrate 302, 2) a given substrate 302 may include more than one type of electronic component 310, 3) a given substrate 302 may include electronic components 310 that are different from the electronic components formed in other substrates 302, or 4) any combination thereof. It will also be recognized, based on the teachings of the present disclosure, that the electronic components 310 may have more than two terminals.

In the example substrate structure 300 shown in FIG. 3A, a first redistribution layer (RDL) 316 is disposed over each substrate 302 that electrically couples the first terminals 312 of the plurality of electronic components 310 of the substrate 302 with a first terminal 318 disposed over an outer edge 320 of the protective shell 304. The example substrate structure 300 further includes a second RDL 322 overlying each substrate 302 that electrically couples the second terminals 314 of the plurality of electronic components 310 with a respective second terminal 324 disposed over the outer edge 320 of the protective shell 304. In an aspect, the respective first terminal 318 and the respective second terminal 324 disposed over the outer edge 320 of the protective shell 304 may be configured to electrically couple the substrate structure with an interconnect structure (e.g., an interconnect layer, printed circuit board, etc.)

In an aspect, the example substrate structure 300 includes a plurality of dielectric layers 326, 328, 330, and 332 disposed over each substrate 302. Here, a patterned dielectric layer 326 electrically isolates the first terminals 312 from the second terminals 314 of the plurality of electronic components 310. A patterned dielectric layer 328 electrically isolates the portions 340 of the first RDL 316 that are coupled to the first terminals 312 of the electronic components 310 from the portions 342 of the second RDL 322 that are coupled to the second terminals 314 of the electronic components 310. A patterned dielectric layer 330 electrically isolates the first RDL 316 from the second RDL 322. A dielectric layer 332 separates the second RDL 322 from the adjacent substrate 302. In an aspect, the patterned dielectric layer 330 and the dielectric layer 332 may be formed from a polyimide (PI) material.

In an aspect, the plurality of substrates 302 are stacked along a length of the substrate structure 300. The first RDL 316 of each substrate 302 of the plurality of substrates extends along a height of the substrate structure 300. The second RDL 322 of each substrate 302 of the plurality of substrates extends along the height of the substrate structure 300. The outer edge 320 of the substrate structure 300 extends along the length of the substrate structure 300.

FIG. 3B is a top view of the example substrate structure 300 showing the relationship between the first RDL 316 and the second RDL 322 of each stacked substrate 302. As shown in FIG. 3B, first RDL 316 and the second RDL 322 are laterally offset from one another, something that is not immediately apparent when viewing FIG. 3A alone.

Figure 4A:
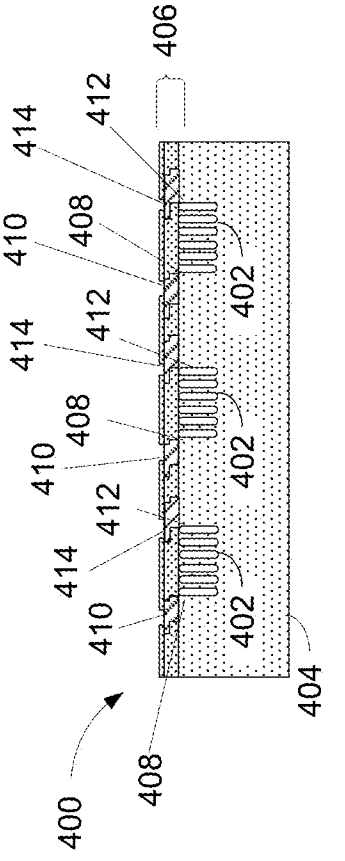
FIG. 4A through FIG. 4M depict example operations that may be used to fabricate a substrate structure, according to aspects of the disclosure.

FIG. 4A through FIG. 4L depict example operations that may be used to fabricate a substrate structure, according to aspects of the disclosure. FIG. 4A shows an example of an initial substrate configuration 400 that may be received for fabricating the substrate structure. In this example, the initial substrate configuration 400 includes a plurality of DTCs 402 formed in a substrate 404. The initial substrate configuration 400 includes an initial metallization structure 406 disposed over an upper surface of the substrate 404. The initial metallization structure 406 electrically couples each first terminal 408 of the DTCs 402 with a respective pad 410. Likewise, the initial metallization structure 406 electrically couples each second terminal 412 of the DTCs 402 with a respective pad 414. In an aspect, the substrate may be subject to a wafer thinning and/or sawing operation to reduce its thickness.

Figure 4B:
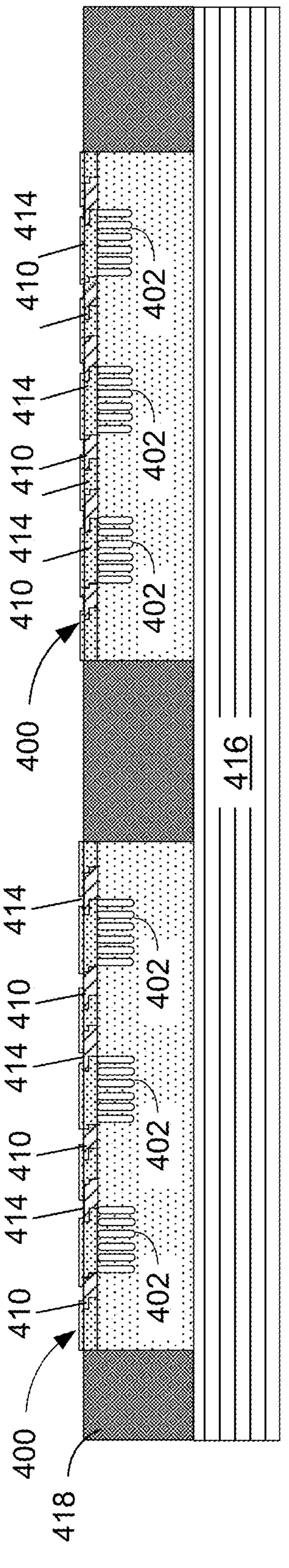

In FIG. 4B, a plurality of the initial substrate configurations 400 have been placed on a carrier 416 and encapsulated in a molding compound 418, which will be used to form a part of a protective shell of the final substrate structure. In an aspect, the molding compound may initially be placed about the entire periphery of the initial substrate configurations 400 and subjected to a grinding and/or chemical mechanical polishing operation to expose the pads 410 and 414.

Figure 4C:
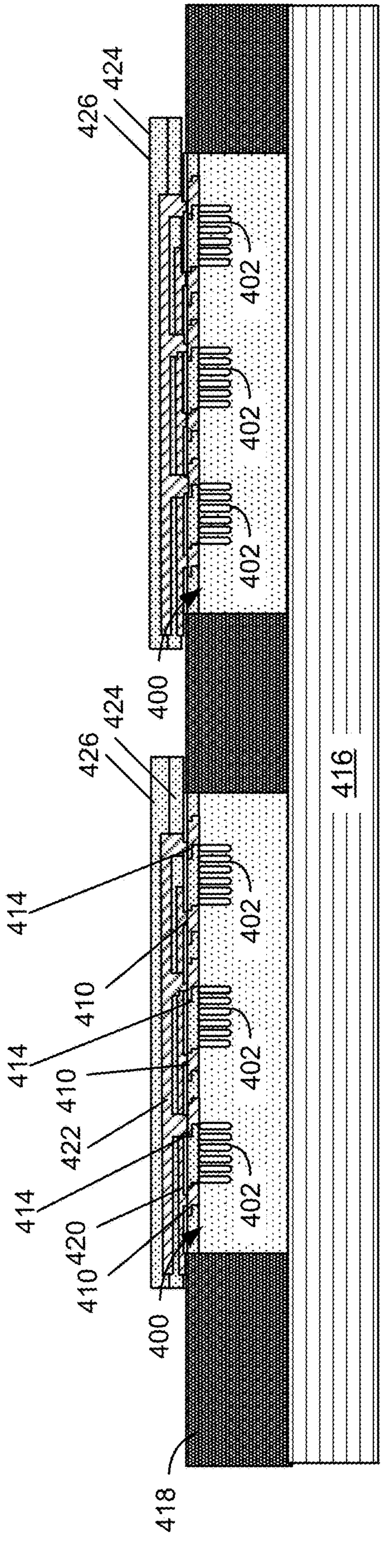

In FIG. 4C, a first RDL 420 and a second RDL 422 are formed over the upper surface of each initial substrate configuration 400. The first RDL 420 electrically couples the pads 410 (and thereby the first terminals of the DTCs) of the respective initial substrate configuration 400 with one another. Similarly, the second RDL 422 electrically couples the pads 414 (and thereby the second terminals of the DTCs) of the respective substrate configuration 400 with one another. In this example, the first RDL 420 and second RDL 422 are separated from one another by a dielectric layer 424 (e.g., a polyimide layer). Also, a further dielectric layer 426 is disposed over the second RDL 422.

Figure 4D:
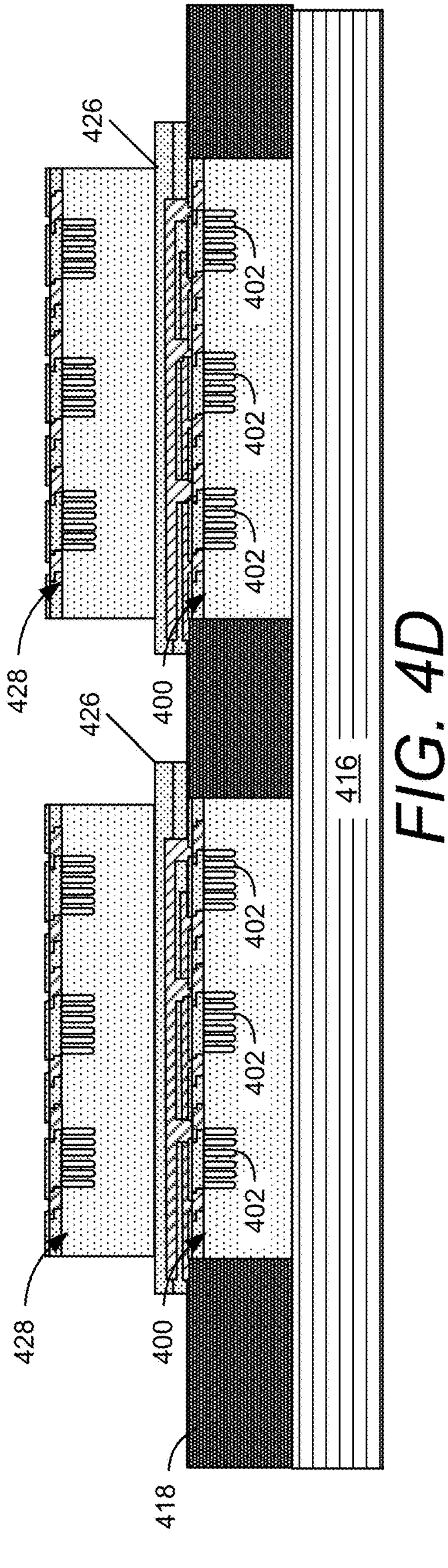

In FIG. 4D, a further set of initial substrate configurations 428 are respectively disposed over the dielectric layers 426 associated with each initial substrate configuration 400.

Figure 4E:
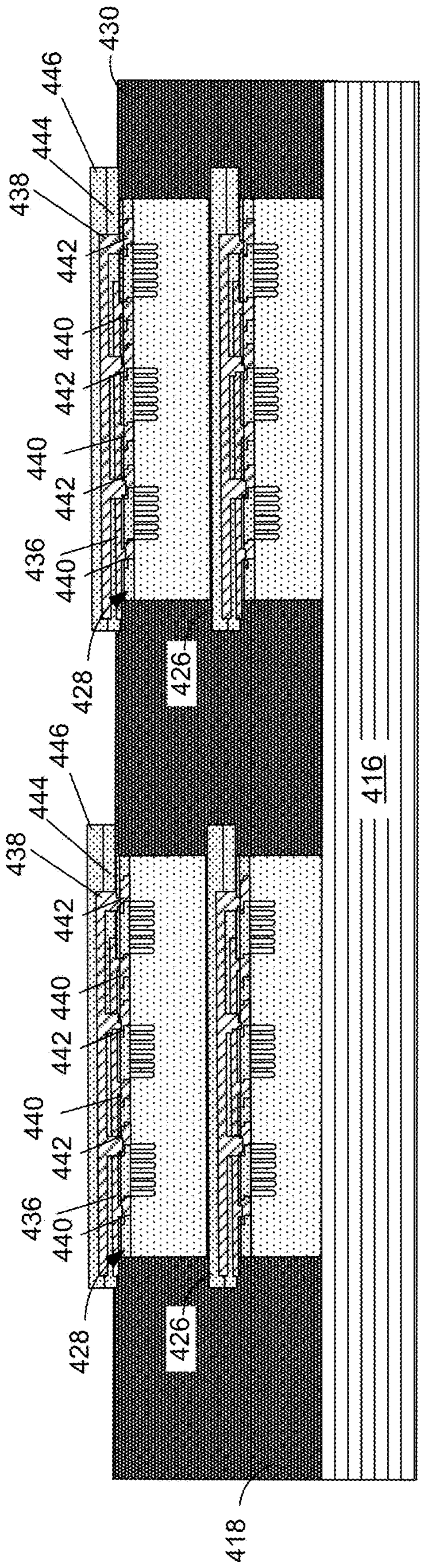

In FIG. 4E, the initial substrate configurations 428 have been encapsulated in a further layer of molding compound 430, which will be used along with the layer of molding compound 418 to form a part of the protective shell of the final substrate structure.

A third RDL 436 and a fourth RDL 438 are formed over the upper surface of each initial substrate configuration 428. The third RDL 436 electrically couples the pads 440 (and thereby the first terminals of the DTCs) of the respective initial substrate configuration 428 with one another. Similarly, the fourth RDL 438 electrically couples the pads 442 (and thereby the second terminals of the DTCs) of the respective substrate configuration 428 with one another. In this example, the third RDL 436 and fourth RDL 438 are separated from one another by a dielectric layer 444 (e.g., a polyimide layer). Also, a further dielectric layer 446 is disposed over the fourth RDL 438.

Figure 4F:
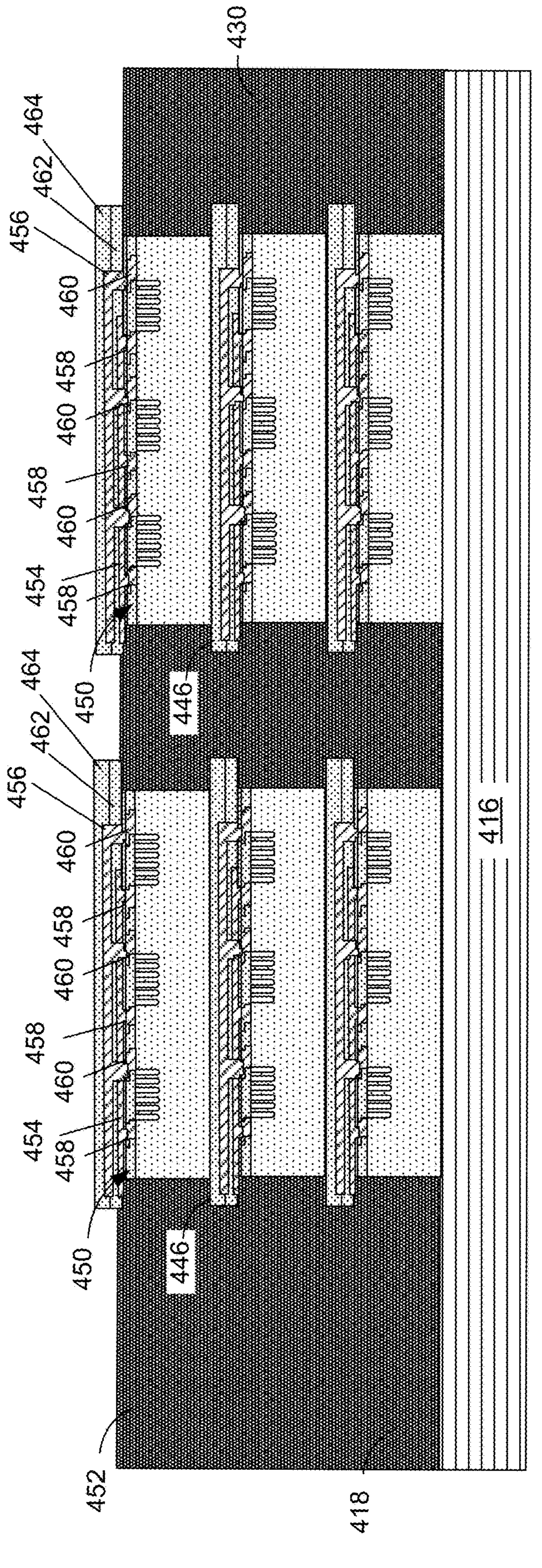

In FIG. 4F, a further set of initial substrate configurations 450 are respectively disposed over the dielectric layers 426 associated with each initial substrate configuration 428. Here, the initial substrate configurations 450 have been encapsulated in a further layer of molding compound 452, which will be used along with the layers of molding compound 418 and 430 to form a part of the protective shell of the final substrate structure.

A fifth RDL 454 and a sixth RDL 456 are formed over the upper surface of each initial substrate configuration 450. The fifth RDL 454 electrically couples the pads 458 (and thereby the first terminals of the DTCs) of the respective initial substrate configuration 450 with one another. Similarly, the sixth RDL 456 electrically couples the pads 460 (and thereby the second terminals of the DTCs) of the respective initial substrate configuration 450 with one another. In this example, the fifth RDL 454 and sixth RDL 456 are separated from one another by a dielectric layer 462 (e.g., a polyimide layer). Also, a further dielectric layer 464 is disposed over the sixth RDL 456.

Figure 4G:
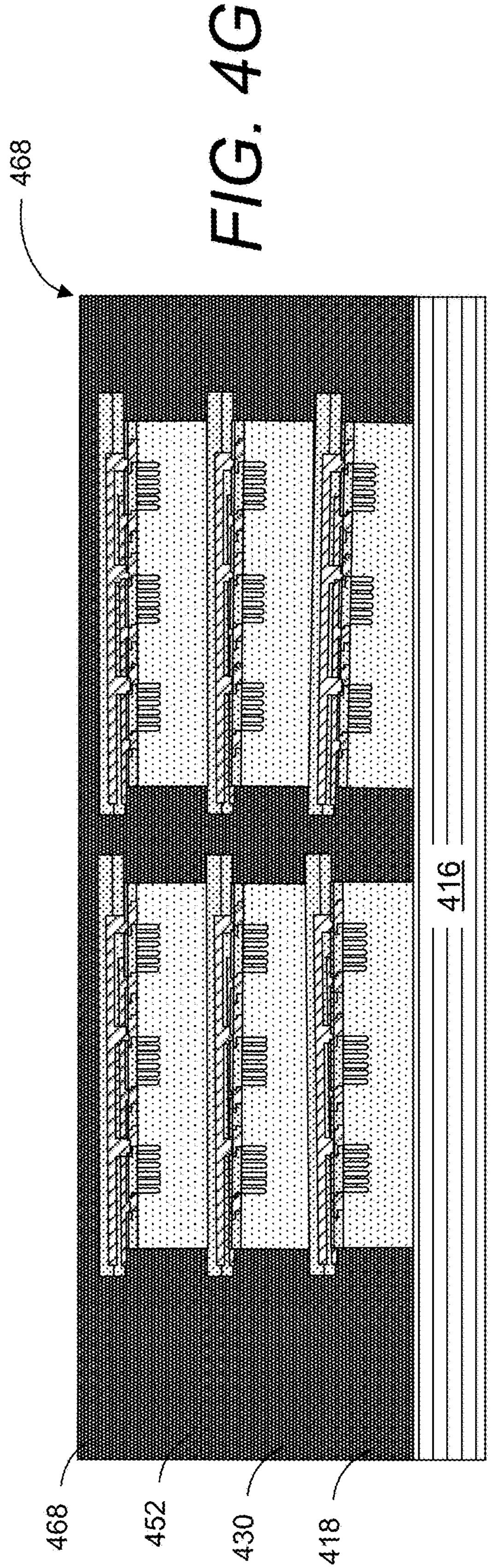

In FIG. 4G, a further layer of molding compound 468 is disposed over the fifth RDL 454, sixth RDL 456, the dielectric layer 462, and the dielectric layer 464, which will be used along with the layers of molding compound 418, 430, and 452 to form a part of the protective shell of the final substrate structure.

Figure 4H:
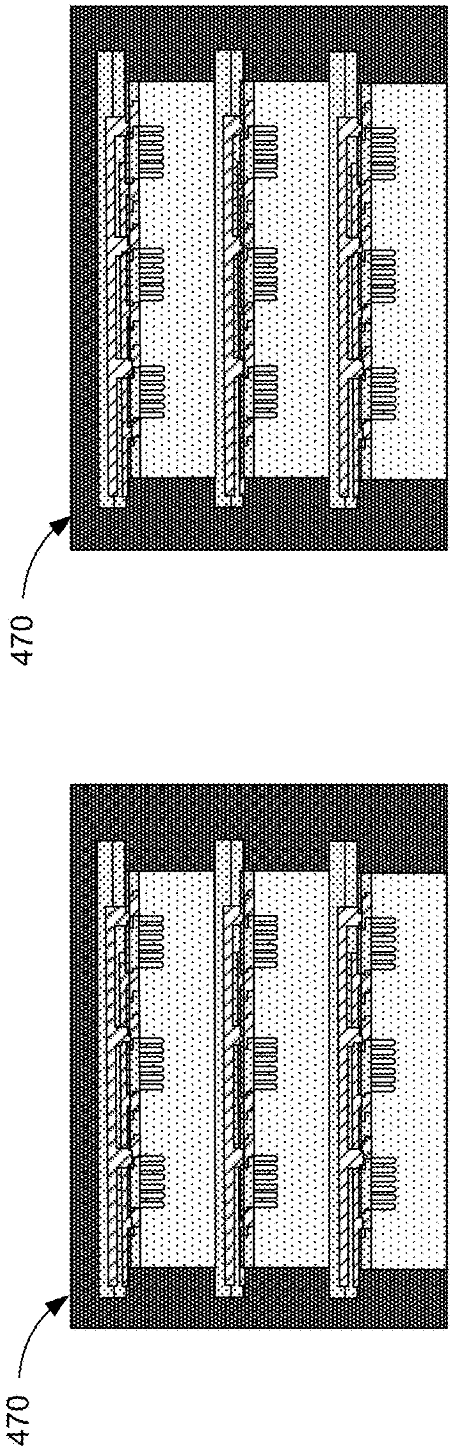

In FIG. 4H, the structure 466 shown in FIG. 4G has been debonded from the carrier 416 and separated (e.g., through a sawing process) to form multiple substructures 470 (only two such substructures 470 being shown in FIG. 4H).

Figure 4I:
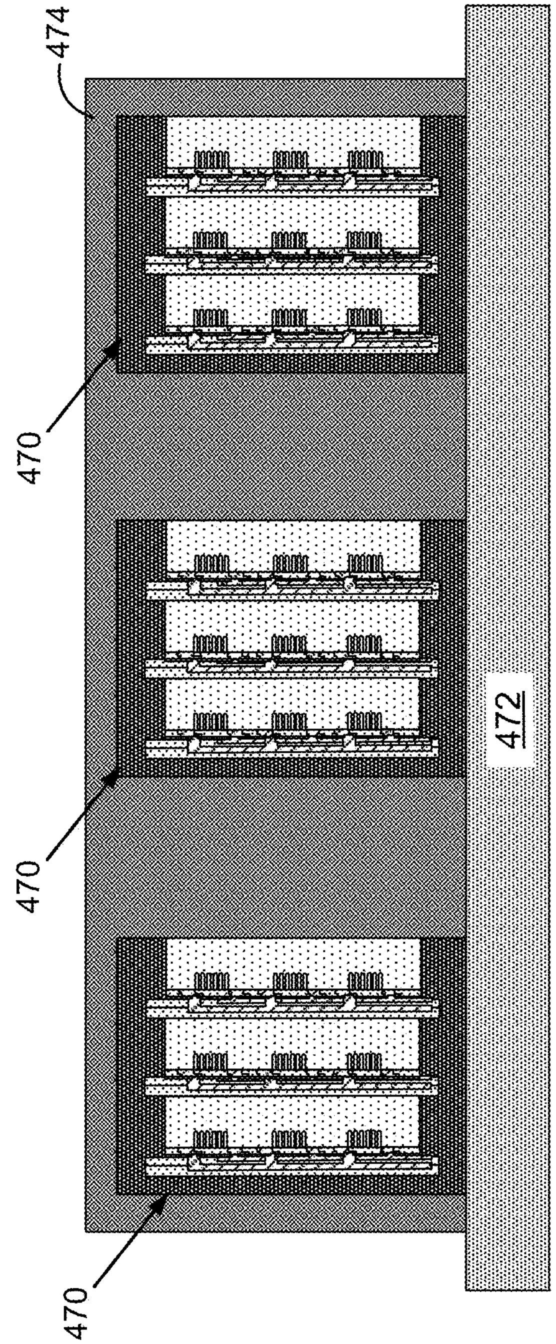

In FIG. 4I, multiple substructures 470 are reoriented to a further processing position and bonded to another carrier

472. A layer of molding compound 474 is formed about all of the multiple substructures 470. In an aspect, the material used to form the layer of molding compound 474 may be the same or different than the material used to form the layers of molding compound 418, 430, 452, and 468 (see FIG. 4G).

Figure 4J:
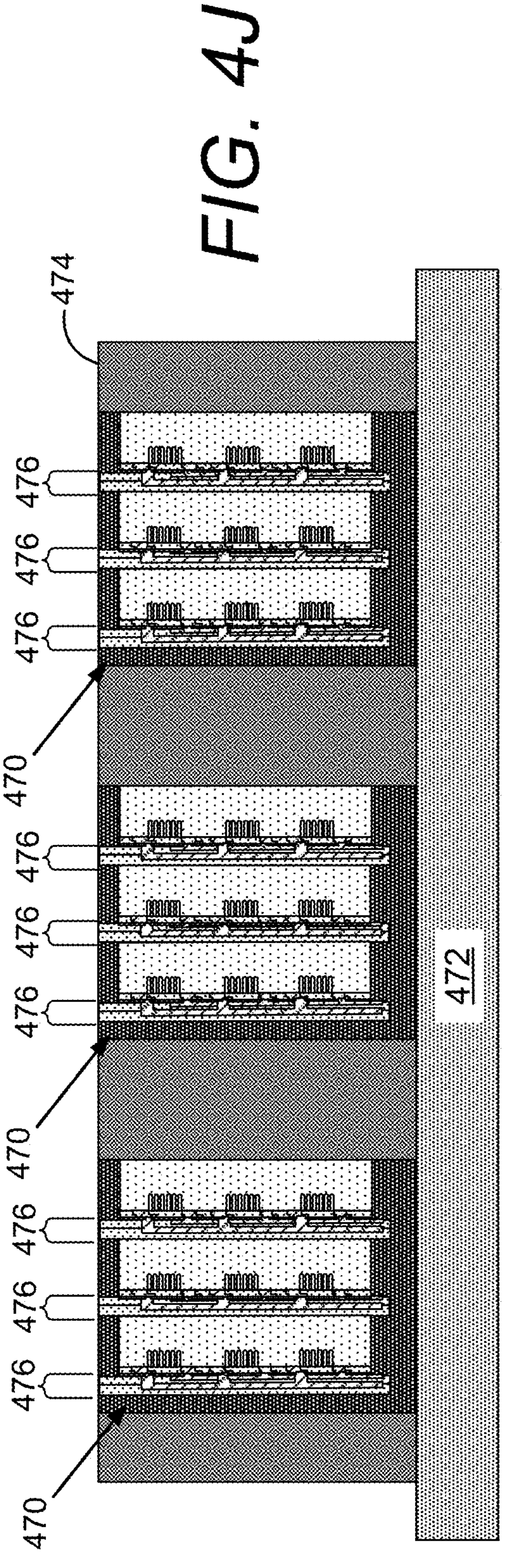

In FIG. 4J, the upper portion of the layer of molding compound 474 has been removed (e.g., through a grinding and/or chemical mechanical polishing process) to expose the conductive end portions of the RDL structures 476 of the multiple substructures 470.

Figure 4K:
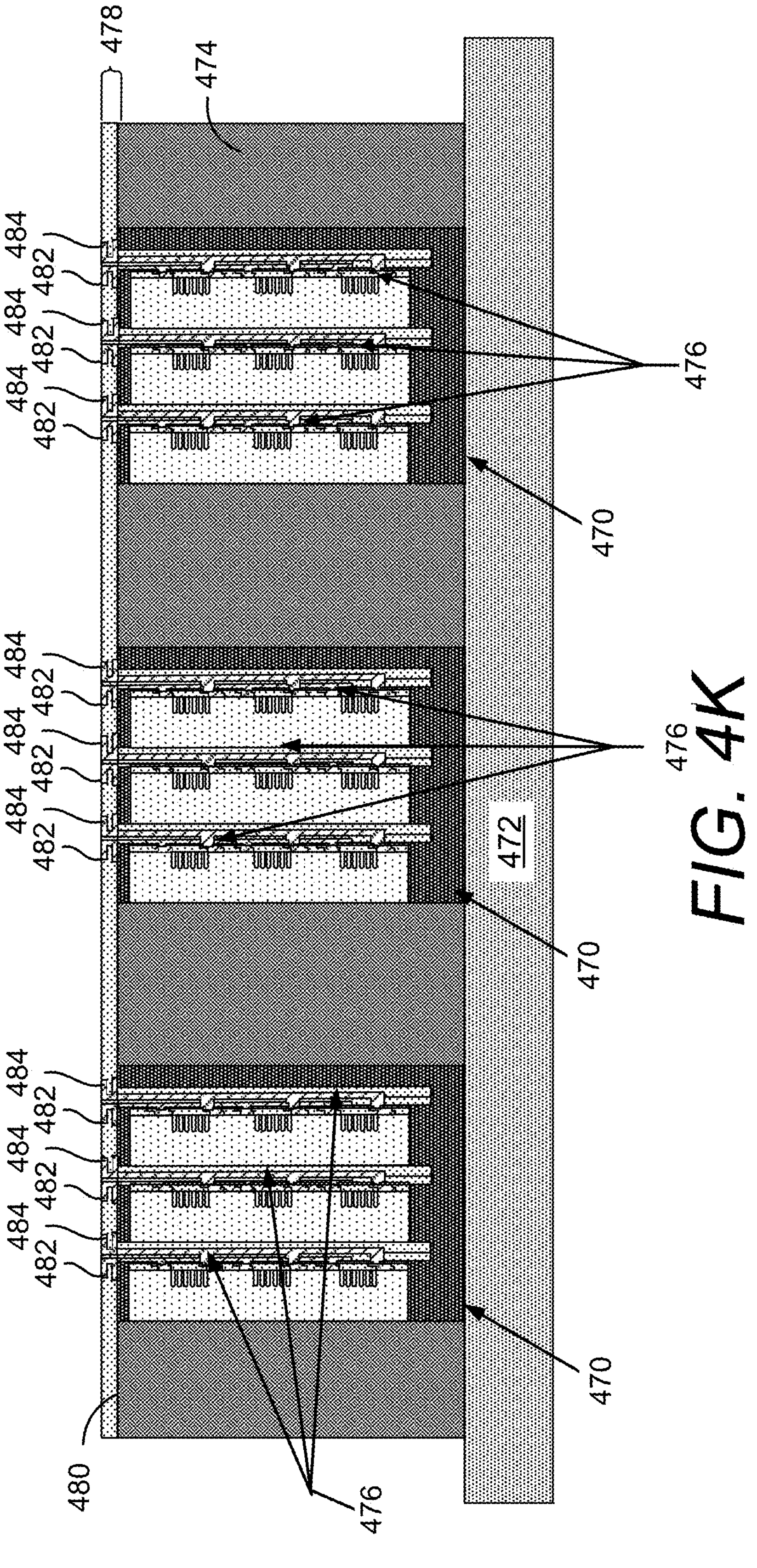

In FIG. 4K, a metallization structure 478 is formed over outer edge 480. In an aspect, the metallization structure 478 electrically couples each of the RDLs of the RDL structures 476 to respective pads 482 and 484.

Figure 4L:
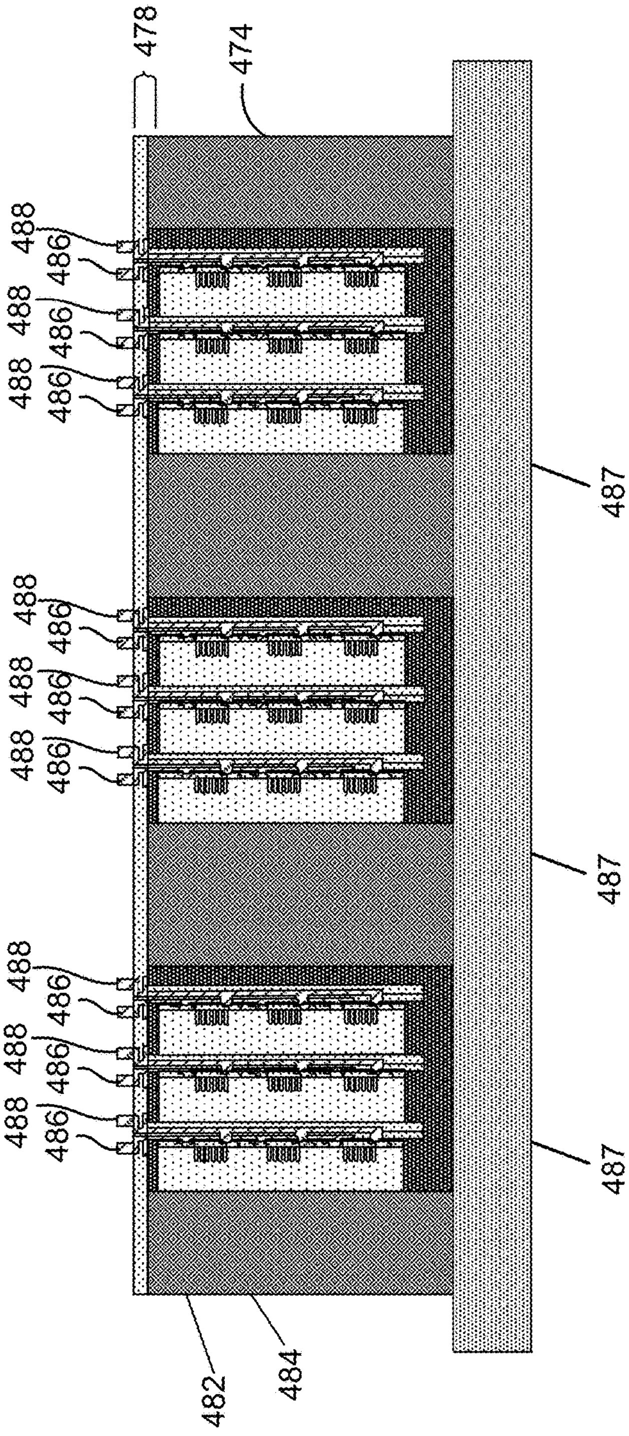

In FIG. 4L, terminals 486 and 488 are formed over the metallization structure 478 that are electrically coupled to the respective pads 482 and 484.

Figure 4M:
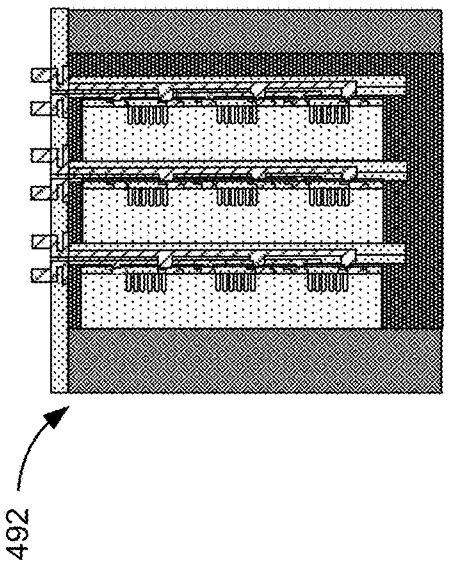

In FIG. 4M, the layers of molding compound (e.g., layers 418, 430, 452, and 468, labeled collectively as layer 487) and 474 are debonded from the carrier 472. and the resulting compound structure 490 (see FIG. 4L) is then subject to a separation process (e.g., sawing operation) to form distinct substrate structures 492 such as the substrate structure 300 shown in FIG. 3A.

Figure 5:
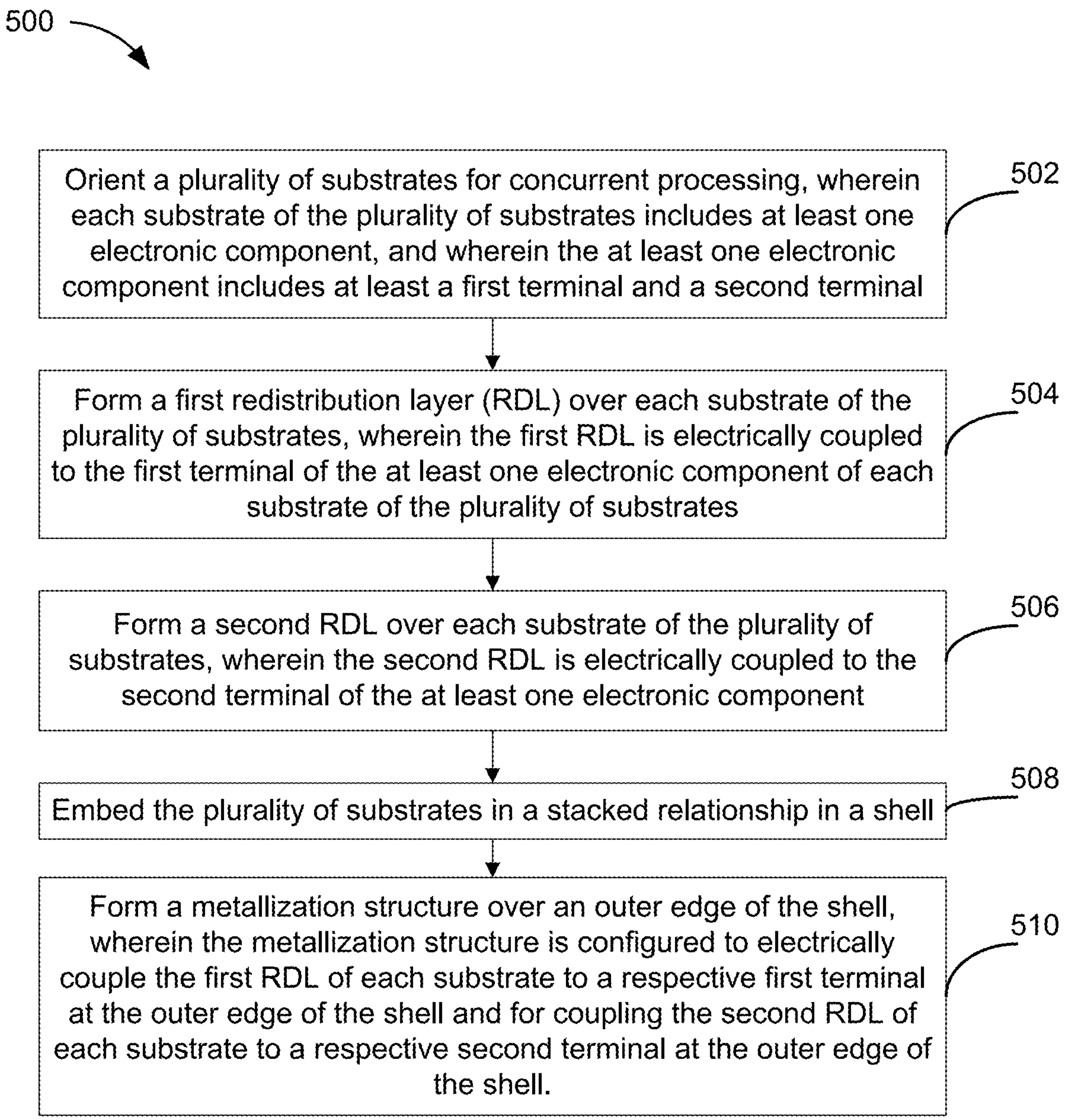
FIG. 5 is a flowchart showing an example method for fabricating a substrate structure, according to aspects of the disclosure.

FIG. 5 is a flowchart showing an example method 500 for fabricating a substrate structure, according to aspects of the disclosure. At operation 502, a plurality of substrates are oriented for concurrent processing, wherein each substrate of the plurality of substrates includes at least one electronic component, and wherein the at least one electronic component includes at least a first terminal and a second terminal. At operation 504, a first redistribution layer (RDL) is formed over each substrate of the plurality of substrates, wherein the first RDL is electrically coupled to the first terminal of the at least one electronic component of each substrate of the plurality of substrates. At operation 506, a second RDL is formed over each substrate of the plurality of substrates in, wherein the second RDL is electrically coupled to the second terminal of the at least one electronic component. At operation 508, the plurality of substrates are encapsulated in a stacked relationship in a shell. At operation 510, a metallization structure is formed over an outer edge of the shell, wherein the metallization structure is configured to electrically couple the first RDL of each substrate to a respective first terminal at the outer edge of the shell and for coupling the second RDL of each substrate to a respective second terminal at the outer edge of the shell.

A technical advantage of the example method 500 is that it may be used to form a substrate structure that interconnects electronic components so as to reduce the size of the substrate structure while increasing the density of the electronic components.

Figure 6:
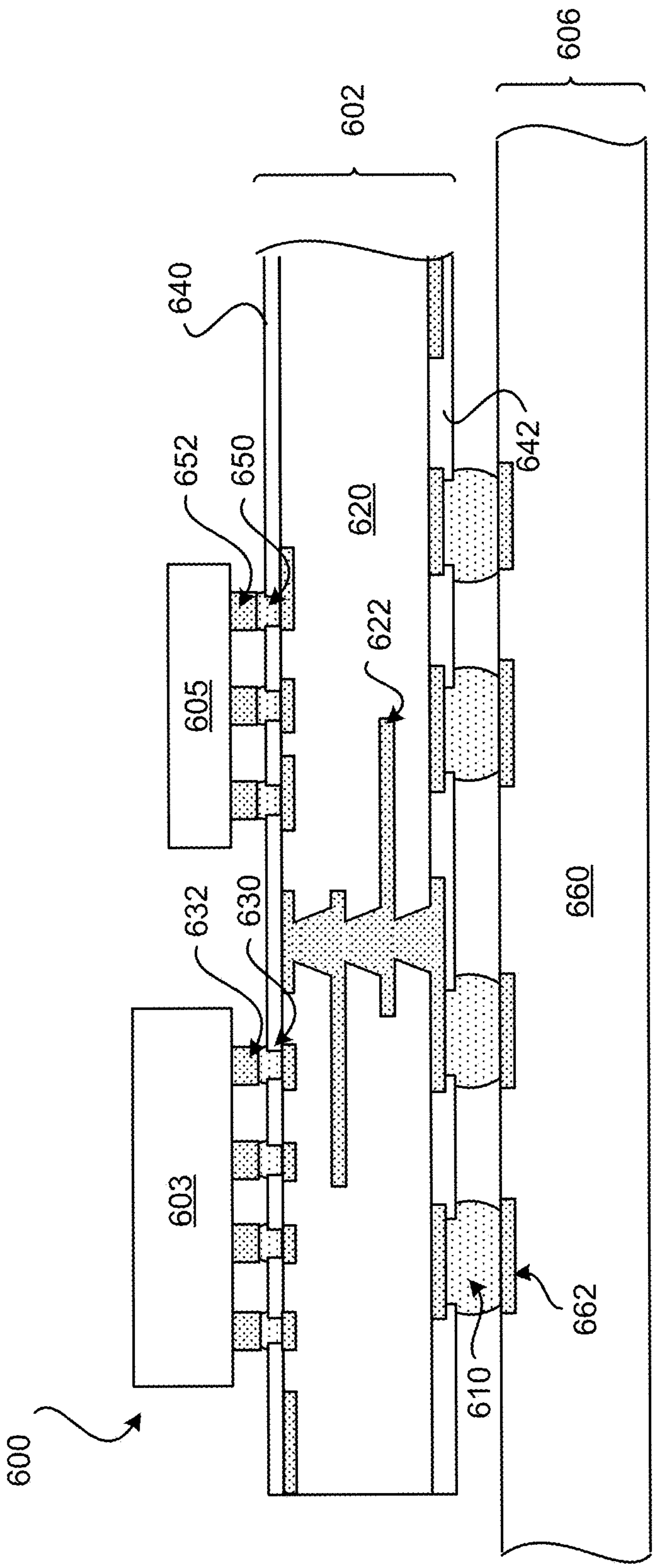
FIG. 6 illustrates a profile view of a package that includes a surface mount asymmetric substrate, an integrated device, and an integrated passive device, according to aspects of the disclosure.

FIG. 6 illustrates a profile view of a package 600 that includes a surface mount asymmetric substrate 602, an integrated device 603, and an integrated passive device 605, according to aspects of the disclosure. The package 600 may be coupled to a printed circuit board (PCB) 606 through a plurality of solder interconnects 610. The PCB 606 may include at least one board dielectric layer 660 and a plurality of board interconnects 662.

The surface mount asymmetric substrate 602 includes at least one dielectric layer 620 (e.g., substrate dielectric layer), a plurality of interconnects 622 (e.g., substrate interconnects), a solder resist layer 640 and a solder resist layer 642. The integrated device 603 may be coupled to the surface mount asymmetric substrate 602 through a plurality of solder interconnects 630. The integrated device 603 may be coupled to the surface mount asymmetric substrate 602 through a plurality of pillar interconnects 632 and the plurality of solder interconnects 630. The integrated passive device 605 may be coupled to the surface mount asymmetric substrate 602 through a plurality of solder interconnects 650. The integrated passive device 605 may be coupled to the surface mount asymmetric substrate 602 through a plurality of pillar interconnects 652 and the plurality of solder interconnects 650.

The package (e.g., 600) may be implemented in a radio frequency (RF) package. The RF package may be a radio frequency front end (RFFE) package. A package (e.g., 600) may be configured to provide Wireless Fidelity (WiFi) communication and/or cellular communication (e.g., 2G, 3G, 4G, 5G). The package (e.g., 600.) may be configured to support Global System for Mobile (GSM) Communications, Universal Mobile Telecommunications System (UMTS), and/or Long-Term Evolution (LTE). The package (e.g., 600) may be configured to transmit and receive signals having different frequencies and/or communication protocols.

Figure 7:
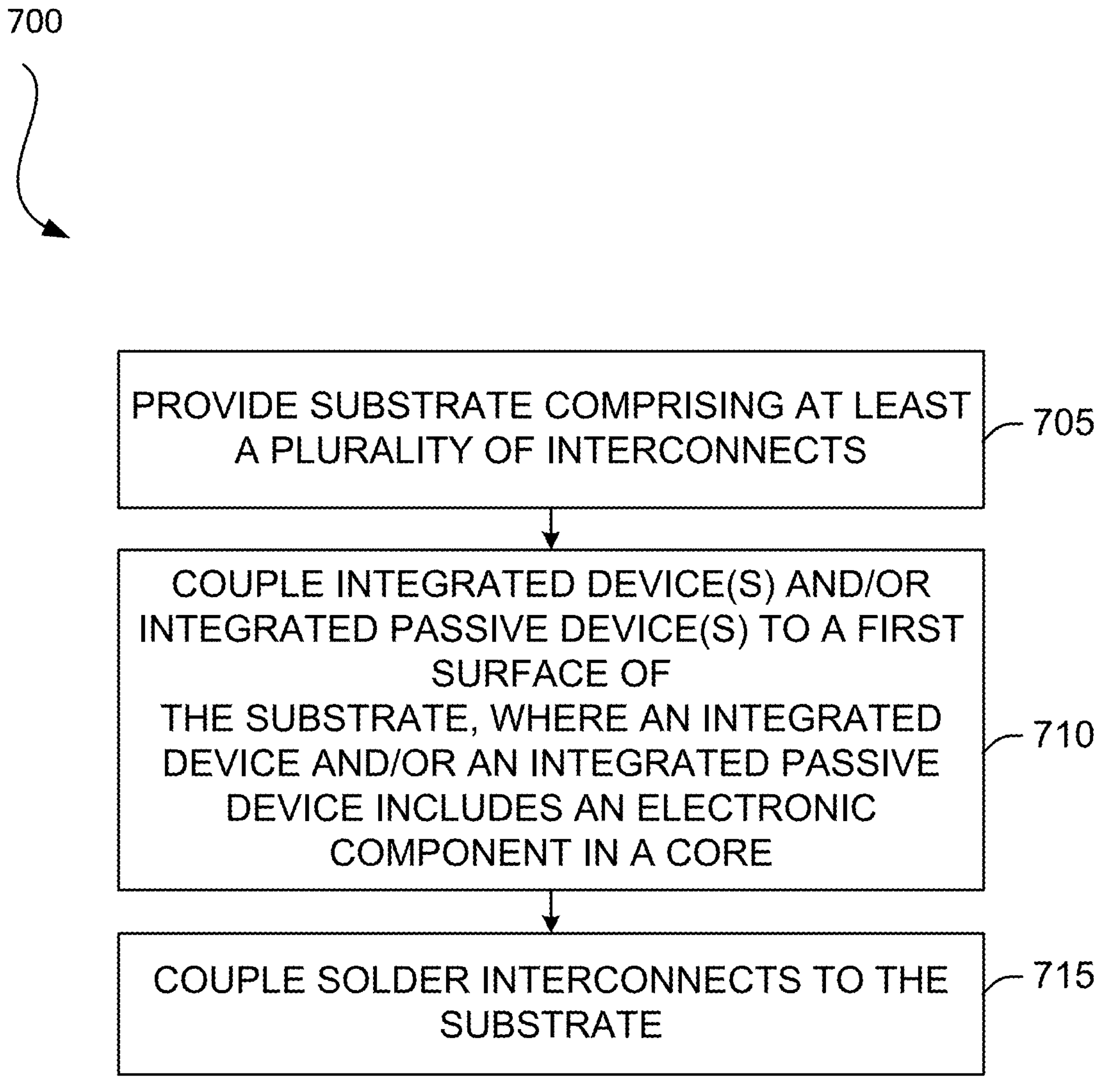
FIG. 7 illustrates an example method for providing or fabricating a package that includes an integrated device comprising an electronic component mounted in a core, according to aspects of the disclosure.

FIG. 7 illustrates an example method 700 for providing or fabricating a package that includes an integrated device comprising an electronic component mounted in a core, according to aspects of the disclosure. In some implementations, the method 700 of FIG. 7 may be used to provide or fabricate the package 600 of FIG. 6 described in the disclosure. However, the method 700 may be used to provide or fabricate any of the packages described in the disclosure.

It should be noted that the method of FIG. 7 may combine one or more processes in order to simplify and/or clarify the method for providing or fabricating a package that includes an integrated device comprising an electronic component mounted in a core, according to aspects of the disclosure. In some implementations, the order of the processes may be changed or modified.

The method provides (at 705) a substrate (e.g., 602). The surface mount asymmetric substrate 602 may be provided by a supplier or fabricated. The surface mount asymmetric substrate 602 includes at least one dielectric layer 620, and a plurality of interconnects 622. The surface mount asymmetric substrate 602 may include an embedded trace substrate (ETS). In some implementations, the at least one dielectric layer 620 may include pre-preg layers.

The method couples (at 710) at least one integrated device (e.g., 603) to the first surface of the substrate (e.g., 602). For example, the integrated device 603 may be coupled to the surface mount asymmetric substrate 602 through the plurality of pillar interconnects 632 and the plurality of solder interconnects 630. The plurality of pillar interconnects 632 may be optional. The plurality of solder interconnects 630 are coupled to the plurality of interconnects 622. A solder reflow process may be used to couple the integrated device 603 to the plurality of interconnects through the plurality of solder interconnects 630.

The method also couples (at 710) at least one integrated passive device (e.g., 605) to the first surface of the substrate (e.g., 602). For example, the integrated passive device 605 may be coupled to the surface mount asymmetric substrate 602 through the plurality of pillar interconnects 652 and the plurality of solder interconnects 650. The plurality of pillar interconnects 652 may be optional. The plurality of solder interconnects 650 are coupled to the plurality of interconnects 622. A solder reflow process may be used to couple the integrated passive device 605 to the plurality of interconnects through the plurality of solder interconnects 650.

The method couples (at 715) a plurality of solder interconnects (e.g., 610) to the second surface of the substrate (e.g., 602). A solder reflow process may be used to couple the plurality of solder interconnects 610 to the substrate.

Figure 8:
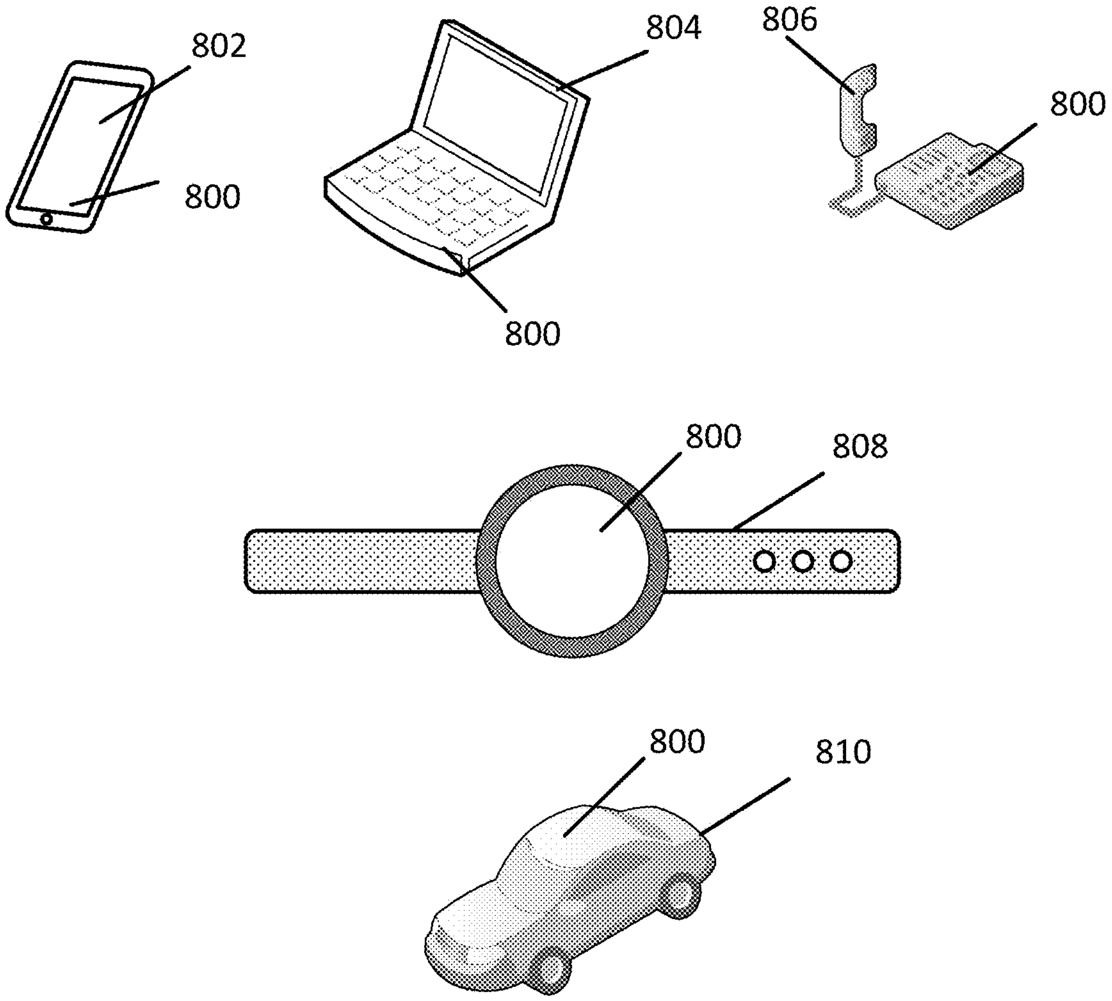
FIG. 8 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC).

FIG. 8 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 802, a laptop computer device 804, a fixed location terminal device 806, a wearable device 808, or automotive vehicle 810 may include a device 800 as described herein. The device 800 may be, for example, any of the devices and/or integrated circuit (IC) packages described herein. The devices 802, 804, 806 and 808 and the vehicle 810 illustrated in FIG. 8 are merely exemplary. Other electronic devices may also feature the device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

Implementation examples are described in the following numbered aspects:

Aspect 1. A substrate structure, comprising: plurality of substrates encapsulated in a shell in a stacked relationship; at least one electronic component in each substrate of the plurality of substrates, wherein the at least one electronic component includes at least a first terminal and a second terminal; a first redistribution layer (RDL) disposed over each substrate of the plurality of substrates configured to electrically couple the first terminal of the at least one electronic component with a respective first terminal disposed over an outer edge of the shell; and a second RDL disposed over each substrate of the plurality of substrates and configured to electrically couple the second terminal of the at least one electronic component with a respective second terminal disposed over the outer edge of the shell.

Aspect 2. The substrate structure of aspect 1, wherein the at least one electronic component in each substrate of the plurality of substrates comprises: a plurality of passive components.

Aspect 3. The substrate structure of any of aspects 1 to 2, wherein the at least one electronic component in each substrate of the plurality of substrates comprise: a plurality of deep trench capacitors.

Aspect 4. The substrate structure of any of aspects 1 to 3, wherein: the respective first terminal disposed over the outer edge of the shell and the respective second terminal disposed over the outer edge of the shell are configured to electrically couple the substrate structure with an interconnect structure.

Aspect 5. The substrate structure of any of aspects 1 to 4, further comprising: a metallization structure disposed at the outer edge of the shell, wherein the metallization structure is configured to electrically couple the first RDL disposed over each substrate of the plurality of substrates with the respective first terminal disposed over the outer edge of the shell.

Aspect 6. The substrate structure of aspect 5, wherein: the metallization structure disposed over the outer edge of the shell is configured to electrically couple the second RDL disposed over each substrate of the plurality of substrates with the respective second terminal disposed over the outer edge of the shell.

Aspect 7. The substrate structure of any of aspects 1 to 6, further comprising: a first dielectric layer disposed over a first side of each substrate of the plurality of substrates and between a first side of the substrate and the first RDL; and a second dielectric layer disposed over the first side of each substrate of the plurality of substrates between the first RDL and the second RDL.

Aspect 8. The substrate structure of aspect 7, further comprising: a third dielectric layer disposed over the second RDL of each substrate of the plurality of substrates.

Aspect 9. The substrate structure of aspect 8, wherein: the third dielectric layer associated with at least one substrate of the plurality of substrates separates the at least one substrate from an adjacent substrate encapsulated in the shell.

Aspect 10. The substrate structure of any of aspects 1 to 9, wherein: the plurality of substrates are stacked along a length of the substrate structure; the first RDL of each substrate of the plurality of substrates extends along a height of the substrate structure; the second RDL of each substrate of the plurality of substrates extends along the height of the substrate structure; and the outer edge of the substrate structure extends along the length of the substrate structure.

Aspect 11. An electronic device, comprising: a substrate structure comprising: plurality of substrates encapsulated in a shell in a stacked relationship; at least one electronic component in each substrate of the plurality of substrates, wherein the at least one electronic component includes at least a first terminal and a second terminal; a first redistribution layer (RDL) disposed over each substrate of the plurality of substrates configured to electrically couple the first terminal of the at least one electronic component with a respective first terminal disposed over an outer edge of the shell; and a second RDL disposed over each substrate of the plurality of substrates and configured to electrically couple the second terminal of the at least one electronic component with a respective second terminal disposed over the outer edge of the shell.

Aspect 12. The electronic device of aspect 11, wherein the at least one electronic component in each substrate the plurality of substrates comprises: a plurality of passive components.

Aspect 13. The electronic device of any of aspects 11 to 12, wherein the at least one electronic component in each substrate of the plurality of substrates comprise: a plurality of deep trench capacitors.

Aspect 14. The electronic device of any of aspects 11 to 13, wherein: the respective first terminal disposed over the outer edge of the shell and the respective second terminal disposed over the outer edge of the shell are configured to electrically coupling the substrate structure with an interconnect structure.

Aspect 15. The electronic device of any of aspects 11 to 14, further comprising: a metallization structure disposed at the outer edge of the shell, wherein the metallization structure is configured to electrically couple the first RDL disposed over each substrate of the plurality of substrates with the respective first terminal disposed over the outer edge of the shell.

Aspect 16. The electronic device of any of aspects 11 to 15, wherein: the metallization structure disposed over the outer edge of the shell is configured to electrically couple the second RDL disposed over each substrate of the plurality of substrates with the respective second terminal disposed over the outer edge of the shell.

Aspect 17. The electronic device of any of aspects 11 to 16, further comprising: a first dielectric layer disposed over a first side of each substrate of the plurality of substrates and between a first side of the substrate and the first RDL; and a second dielectric layer disposed over the first side of each substrate of the plurality of substrates between the first RDL and the second RDL.

Aspect 18. The electronic device of any of aspects 11 to 17, further comprising: a third dielectric layer disposed over the second RDL of each substrate of the plurality of substrates.

Aspect 19. The electronic device of aspect 18, wherein: the third dielectric layer associated with at least one substrate of the plurality of substrates separates the at least one substrate from an adjacent substrate encapsulated in the shell.

Aspect 20. The electronic device of any of aspects 11 to 19, wherein: the plurality of substrates are stacked along a length of the substrate structure; the first RDL of each substrate of the plurality of substrates extends along a height of the substrate structure; the second RDL of each substrate of the plurality of substrates extends along the height of the substrate structure; and the outer edge of the substrate structure extends along the length of the substrate structure.

Aspect 21. The electronic device of any of aspects 11 to 20, wherein: the respective first terminal disposed over the outer edge of the shell and the respective second terminal disposed over the outer edge of the shell each comprise a terminal configured to electrically coupling the substrate structure with an interconnect structure.

Aspect 22. The electronic device of any of aspects 11 to 21, wherein the electronic device comprises at least one of: a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, or a device in an automotive vehicle.

Aspect 23. A method of fabricating a substrate structure, comprising: orienting a plurality of substrates for concurrent processing, wherein each substrate of the plurality of substrates includes at least one electronic component, and wherein the at least one electronic component includes at least a first terminal and a second terminal; forming a first redistribution layer (RDL) over each substrate of the plurality of substrates, wherein the first RDL is electrically coupled to the first terminal of the at least one electronic component of each substrate of the plurality of substrates; and forming a second RDL over each substrate of the plurality of substrates will, wherein the second RDL is electrically coupled to the second terminal of the at least one electronic component; encapsulating the plurality of substrates in a stacked relationship in a shell; and forming a metallization structure over an outer edge of the shell, wherein the metallization structure is configured to electrically couple the first RDL of each substrate to a respective first terminal at the outer edge of the shell and for coupling the second RDL of each substrate to a respective second terminal at the outer edge of the shell.

Aspect 24. The method of aspect 23, wherein the at least one electronic component formed in each substrate the plurality of substrates comprises: a plurality of passive components.

Aspect 25. The method of any of aspects 23 to 24, wherein the at least one electronic component formed in each substrate of the plurality of substrates comprise: a plurality of deep trench capacitors.

Aspect 26. The method of any of aspects 23 to 25, comprising: forming the respective first terminal disposed over the outer edge of the shell and the respective second terminal disposed over the outer edge of the shell for electrically coupling the substrate structure with an interconnect structure.

Aspect 27. The method of any of aspects 23 to 26, further comprising: stacking the plurality of substrates along a length of the substrate structure; forming the first RDL of each substrate of the plurality of substrates along a height of the substrate structure; forming the second RDL of each substrate of the plurality of substrates along the height of the substrate structure; and forming the outer edge of the substrate structure extends along the length of the substrate structure.

It is noted that the figures in the disclosure may represent actual representations and/or conceptual representations of various parts, components, objects, devices, packages, integrated devices, integrated circuits, and/or transistors. In some instances, the figures may not be to scale. In some instances, for the purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on the bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or encapsulated in a component). Thus, for example, a first component that is over the second component may mean that (1) the first component is over the second component, but not directly touching the second component, (2) the first component is on (e.g., on a surface of) the second component, and/or (3) the first component is in (e.g., encapsulated in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metallization layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of an aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A substrate structure, comprising:

plurality of substrates encapsulated in a shell in a stacked relationship along a length of the substrate structure, wherein the shell comprises a molding compound;

at least one electronic component in each substrate of the plurality of substrates, wherein the at least one electronic component includes at least a first terminal and a second terminal;

a first redistribution layer (RDL) disposed over each substrate of the plurality of substrates, the first RDL extending along a height of the substrate structure and configured to electrically couple the first terminal of the at least one electronic component with a respective first terminal disposed over an outer edge of the shell, wherein the outer edge of the shell extends along the length of the substrate structure; and a second RDL disposed over each substrate of the plurality of substrates, the second RDL extending along the height of the substrate structure and configured to electrically couple the second terminal of the at least one electronic component with a respective second terminal disposed over the outer edge of the shell.

2. The substrate structure of claim 1, wherein the at least one electronic component in each substrate of the plurality of substrates comprises:

a plurality of passive components.

3. The substrate structure of claim 1, wherein the at least one electronic component in each substrate of the plurality of substrates comprise:

a plurality of deep trench capacitors.

4. The substrate structure of claim 1, wherein:

the respective first terminal disposed over the outer edge of the shell and the respective second terminal disposed over the outer edge of the shell are configured to electrically couple the substrate structure with an interconnect structure.

5. The substrate structure of claim 1, further comprising:

a metallization structure disposed at the outer edge of the shell, wherein the metallization structure is configured to electrically couple the first RDL disposed over each substrate of the plurality of substrates with the respective first terminal disposed over the outer edge of the shell.

6. The substrate structure of claim 5, wherein:

the metallization structure disposed over the outer edge of the shell is configured to electrically couple the second RDL disposed over each substrate of the plurality of substrates with the respective second terminal disposed over the outer edge of the shell.

7. The substrate structure of claim 1, further comprising:

a first dielectric layer disposed over a first side of each substrate of the plurality of substrates and between a first side of the substrate and the first RDL; and a second dielectric layer disposed over the first side of each substrate of the plurality of substrates between the first RDL and the second RDL.

8. The substrate structure of claim 7, further comprising:

a third dielectric layer disposed over the second RDL of each substrate of the plurality of substrates.

9. The substrate structure of claim 8, wherein:

the third dielectric layer associated with at least one substrate of the plurality of substrates separates the at least one substrate from an adjacent substrate encapsulated in the shell.

10. An electronic device, comprising:

a substrate structure comprising:

plurality of substrates encapsulated in a shell in a stacked relationship along a length of the substrate structure, wherein the shell comprises a molding compound;

at least one electronic component in each substrate of the plurality of substrates, wherein the at least one electronic component includes at least a first terminal and a second terminal;

a first redistribution layer (RDL) disposed over each substrate of the plurality of substrates, the first RDL extending along a height of the substrate structure and configured to electrically couple the first terminal of the at least one electronic component with a respective first terminal disposed over an outer edge of the shell, wherein the outer edge of the shell extends along the length of the substrate structure; and a second RDL disposed over each substrate of the plurality of substrates, the second RDL extending along the height of the substrate structure and configured to electrically couple the second terminal of the at least one electronic component with a respective second terminal disposed over the outer edge of the shell.

11. The electronic device of claim 10, wherein the at least one electronic component in each substrate of the plurality of substrates comprises:

a plurality of passive components.

12. The electronic device of claim 10, wherein the at least one electronic component in each substrate of the plurality of substrates comprise:

a plurality of deep trench capacitors.

13. The electronic device of claim 10, wherein:

the respective first terminal disposed over the outer edge of the shell and the respective second terminal disposed over the outer edge of the shell are configured to electrically couple the substrate structure with an interconnect structure.

14. The electronic device of claim 10, further comprising:

a metallization structure disposed at the outer edge of the shell, wherein the metallization structure is configured to electrically couple the first RDL disposed over each substrate of the plurality of substrates with the respective first terminal disposed over the outer edge of the shell.

15. The electronic device of claim 14, wherein:

the metallization structure disposed over the outer edge of the shell is configured to electrically couple the second RDL disposed over each substrate of the plurality of substrates with the respective second terminal disposed over the outer edge of the shell.

16. The electronic device of claim 10, further comprising:

a first dielectric layer disposed over a first side of each substrate of the plurality of substrates and between a first side of the substrate and the first RDL; and a second dielectric layer disposed over the first side of each substrate of the plurality of substrates between the first RDL and the second RDL.

17. The electronic device of claim 10, further comprising:

a third dielectric layer disposed over the second RDL of each substrate of the plurality of substrates.

18. The electronic device of claim 17, wherein:

the third dielectric layer associated with at least one substrate of the plurality of substrates separates the at least one substrate from an adjacent substrate encapsulated in the shell.

19. The electronic device of claim 10, wherein:

the respective first terminal disposed over the outer edge of the shell and the respective second terminal disposed over the outer edge of the shell each comprise a terminal configured to electrically couple the substrate structure with an interconnect structure.

20. The electronic device of claim 10, wherein the electronic device comprises at least one of:

a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, or a device in an automotive vehicle.

21. A method of fabricating a substrate structure, comprising:

orienting a plurality of substrates for concurrent processing, wherein each substrate of the plurality of substrates includes at least one electronic component, and wherein the at least one electronic component includes at least a first terminal and a second terminal;

forming a first redistribution layer (RDL) over each substrate of the plurality of substrates, wherein the first RDL extends along a height of the substrate structure and is electrically coupled to the first terminal of the at least one electronic component of each substrate of the plurality of substrates;

forming a second RDL over each substrate of the plurality of substrates, wherein the second RDL extends along the height of the substrate structure and is electrically coupled to the second terminal of the at least one electronic component;

encapsulating the plurality of substrates in a stacked relationship in a shell, wherein the shell comprises a molding compound; and forming a metallization structure over an outer edge of the shell, wherein the outer edge of the shell extends along the length of the substrate structure, and wherein the metallization structure is configured to electrically couple the first RDL of each substrate to a respective first terminal at the outer edge of the shell and for coupling the second RDL of each substrate to a respective second terminal at the outer edge of the shell.

22. The method of claim 21, wherein the at least one electronic component formed in each substrate of the plurality of substrates comprises:

a plurality of passive components.

23. The method of claim 21, wherein the at least one electronic component formed in each substrate of the plurality of substrates comprise:

a plurality of deep trench capacitors.

24. The method of claim 21, comprising:

forming the respective first terminal disposed over the outer edge of the shell and the respective second terminal disposed over the outer edge of the shell for electrically coupling the substrate structure with an interconnect structure.

* * * * *